United States Patent [19]
Clemenz et al.

[11] Patent Number: 6,067,702
[45] Date of Patent: *May 30, 2000

[54] STATOR MANUFACTURING AND TESTING METHOD AND APPARATUS

[75] Inventors: Gary E. Clemenz, Bellbrook; Raymond S. Furlong; Lawrence E. Newman, both of Tipp City, all of Ohio

[73] Assignee: Globe Products Inc., Huber Heights, Ohio

[ * ] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/716,149

[22] PCT Filed: Mar. 14, 1995

[86] PCT No.: PCT/US95/03052

§ 371 Date: Jan. 13, 1997

§ 102(e) Date: Jan. 13, 1997

[87] PCT Pub. No.: WO95/25377

PCT Pub. Date: Sep. 21, 1995

Related U.S. Application Data

[63] Continuation-in-part of application No. 08/212,262, Mar. 14, 1994, abandoned, and application No. 08/359,455, Dec. 19, 1994, abandoned.

[51] Int. Cl.[7] .............................. H02K 15/04; H01R 4/24; G01R 31/06

[52] U.S. Cl. ............................ 29/596; 29/605; 29/407.01; 29/593; 29/742; 29/705; 29/732; 324/546; 439/391; 439/410; 242/432

[58] Field of Search ........................... 29/407.01, 407.05, 29/596, 605, 564.4, 705, 732, 742, 593, 736; 269/254 R; 439/436, 391, 395, 409, 410; 324/545, 546, 772; 242/432, 7.07

[56] References Cited

U.S. PATENT DOCUMENTS

| | | | |
|---|---|---|---|
| 830,675 | 9/1906 | Rosenberger | 439/410 |
| 1,188,749 | 6/1916 | Frankel | 439/410 |
| 1,500,641 | 7/1924 | Sabourin | 439/410 |
| 2,903,064 | 9/1959 | Blonder . | |
| 3,455,007 | 7/1969 | Green | 29/410 |
| 3,626,358 | 12/1971 | Klassen | 439/410 |
| 3,706,122 | 12/1972 | La Valle | 29/705 |
| 3,932,811 | 1/1976 | Branch | 29/596 |
| 4,815,673 | 3/1989 | Wheeler | 29/596 X |
| 4,957,452 | 9/1990 | Bolliger | 439/410 |
| 4,984,353 | 1/1991 | Santandrea et al. | 29/596 X |
| 5,186,405 | 2/1993 | Beakes et al. . | |
| 5,186,648 | 2/1993 | Senra | 439/409 |
| 5,269,206 | 12/1993 | Yagawa . | |
| 5,370,324 | 12/1994 | Beakes et al. . | |
| 5,651,177 | 7/1997 | Newman | 29/596 |
| 5,742,997 | 4/1998 | Beakes et al. | 29/596 |

OTHER PUBLICATIONS

Globe Products Inc. drawing 165820, dated Feb. 15, 1991.
Globe Products Inc. drawing 166420, dated Dec. 22, 1992.

*Primary Examiner*—David P. Bryant
*Attorney, Agent, or Firm*—Roger S. Dybvig

[57] ABSTRACT

Stator coils having lead wires inserted into temporary wire clamps (36) at a winding station are electrically tested before the coil lead wires are removed from the temporary clamps. In one aspect, the clamps each include a jaw (54) formed with a wire-engaging surface (88) which scrapes the insulating coating off from a lead wire as it is inserted therein. The clamps are electrically connected to terminal members (90) which are engageable by electrical test terminal members (100). In a modification, the clamps include a wire-scraping jaw having, in addition to a body formed with a sharpened or knife edge, a shield having wire-guiding surfaces engageable by a lead wire being inserted into the clamp. The wire-guiding surfaces are located adjacent the knife edge and are so positioned that the depth of the insulated wire scraped or cut away by the knife edge is only a few thousandths of an inch.

20 Claims, 8 Drawing Sheets

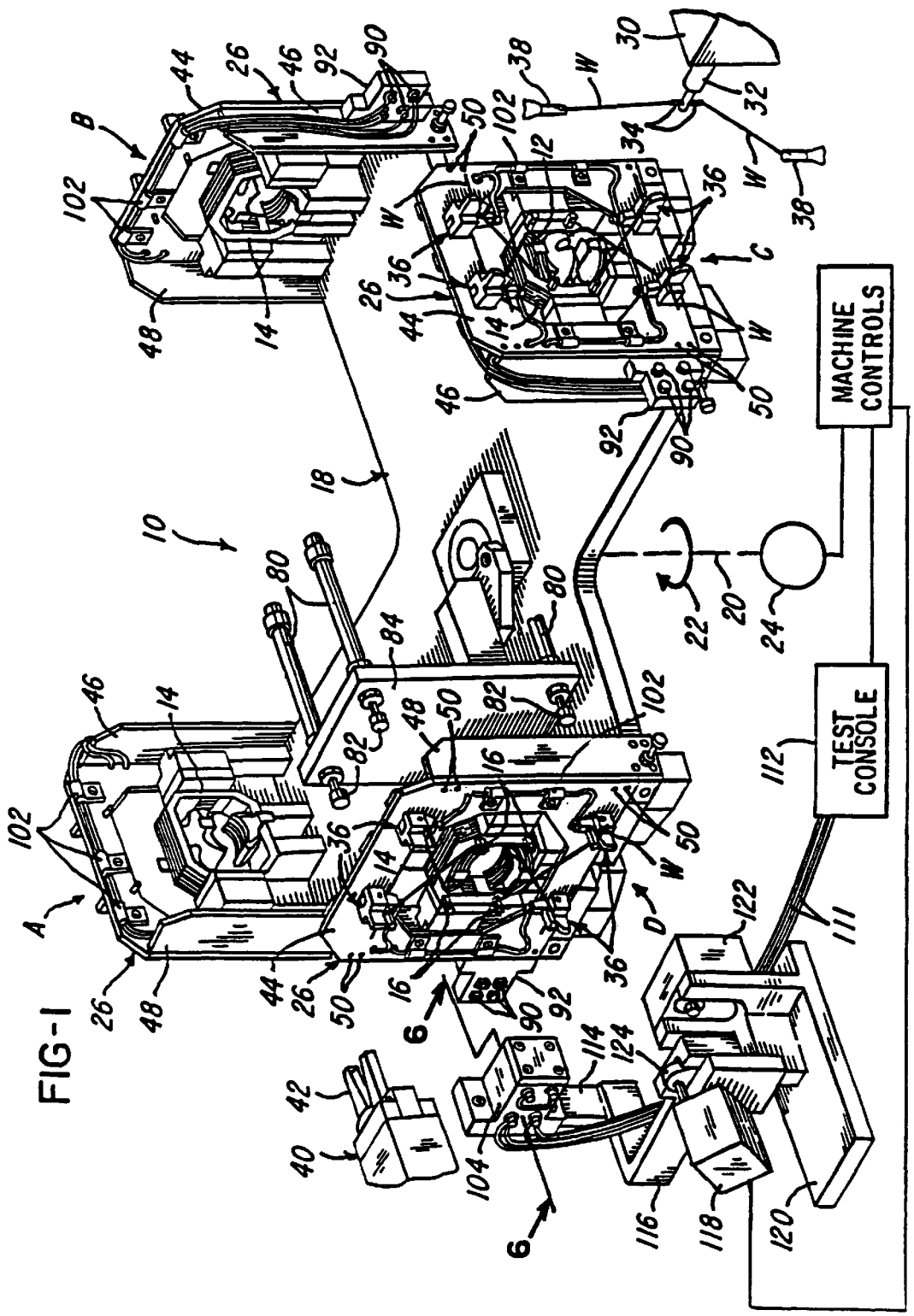

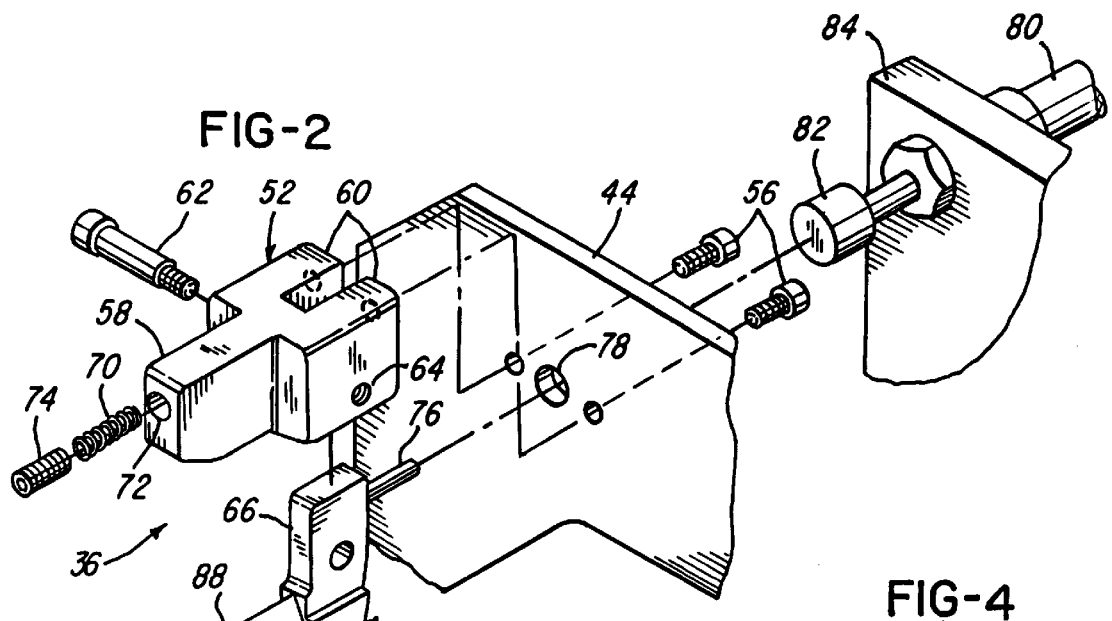
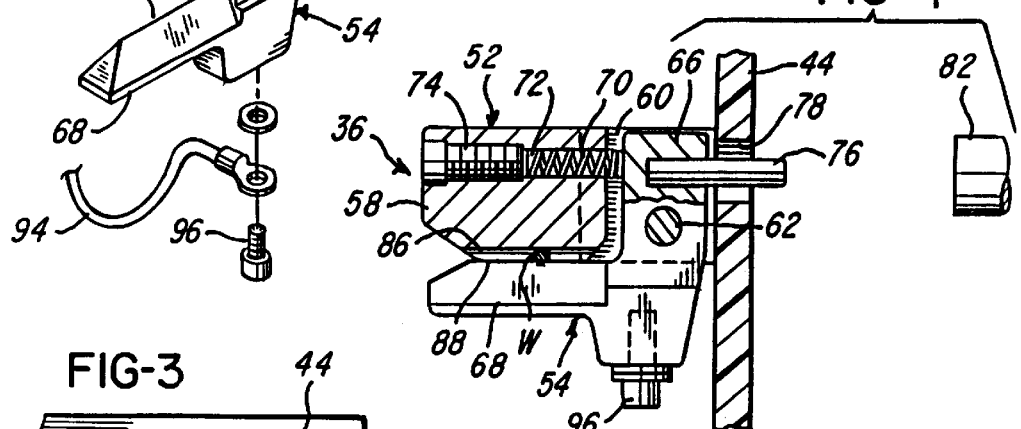
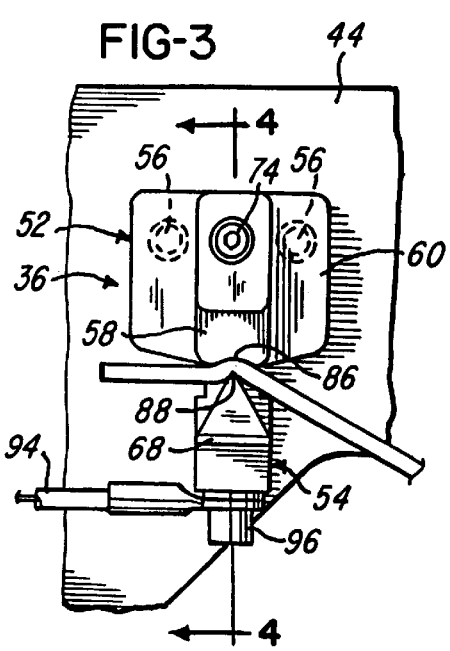
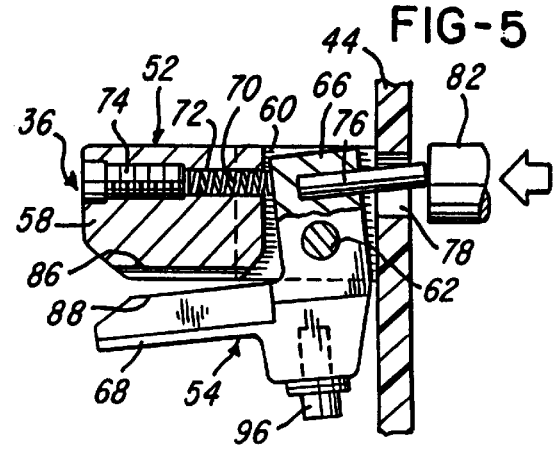

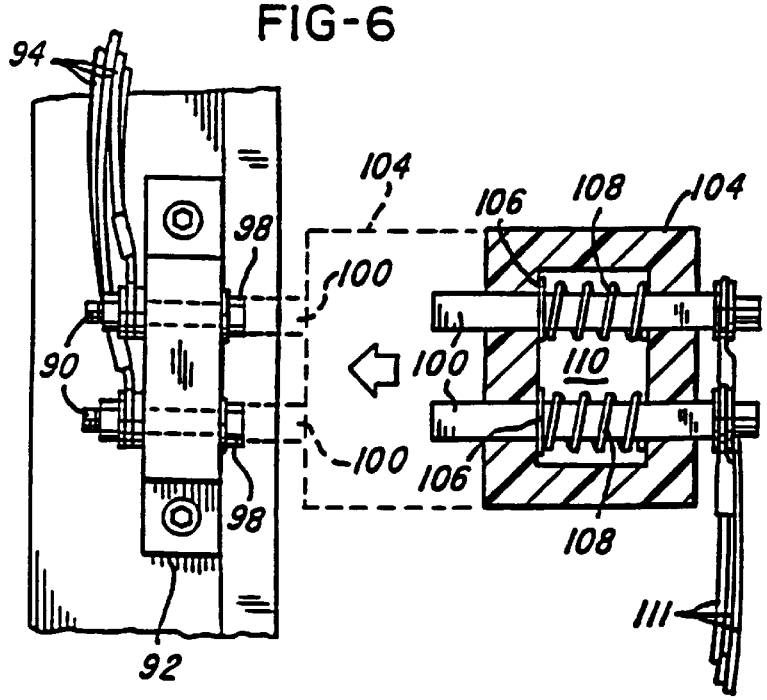
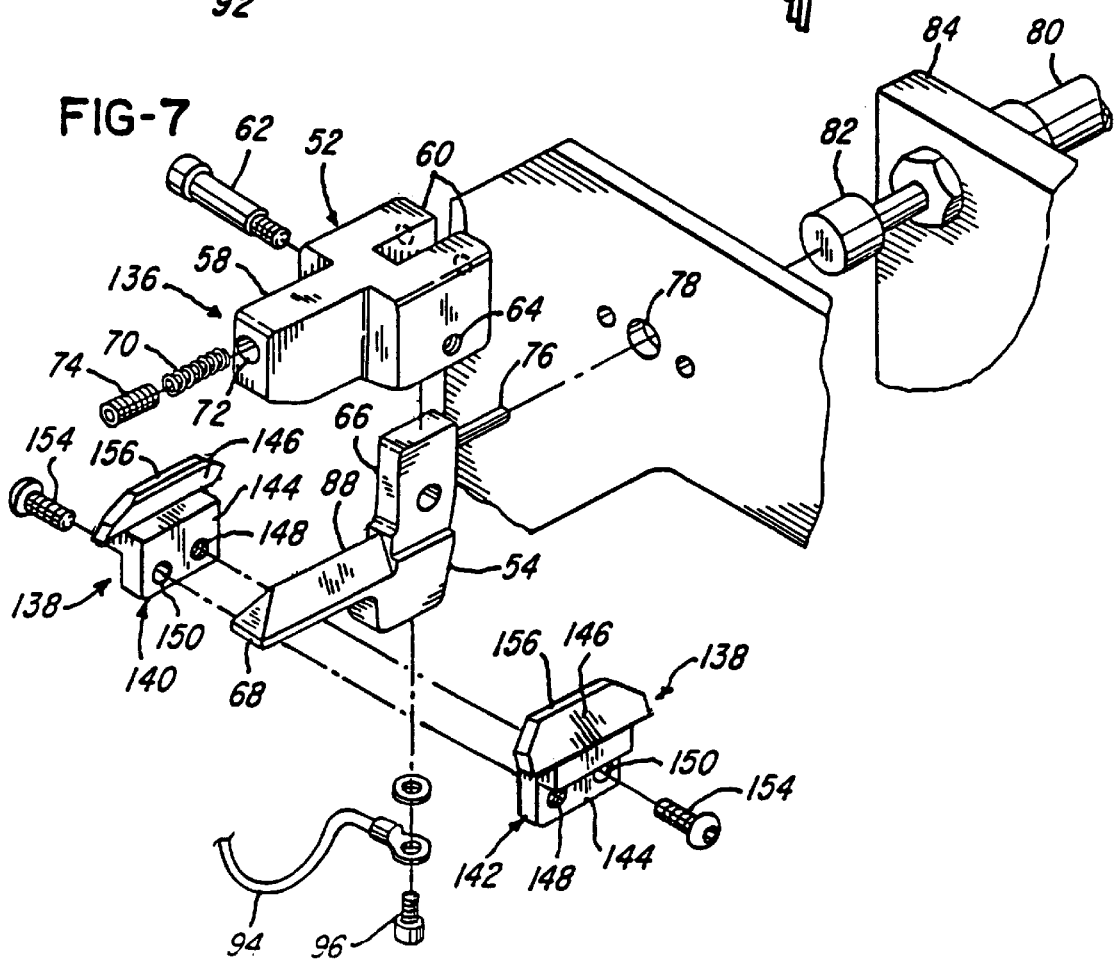

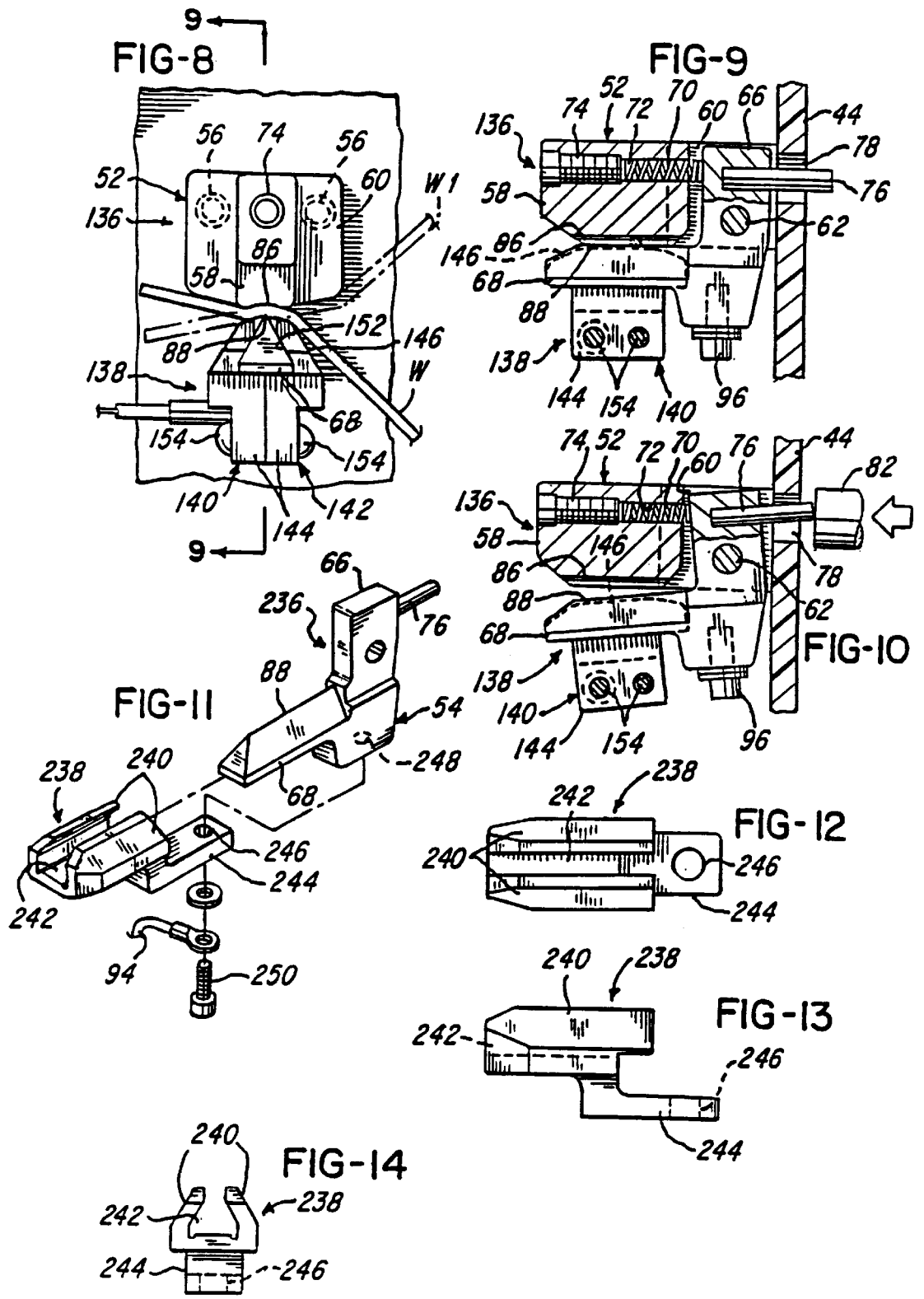

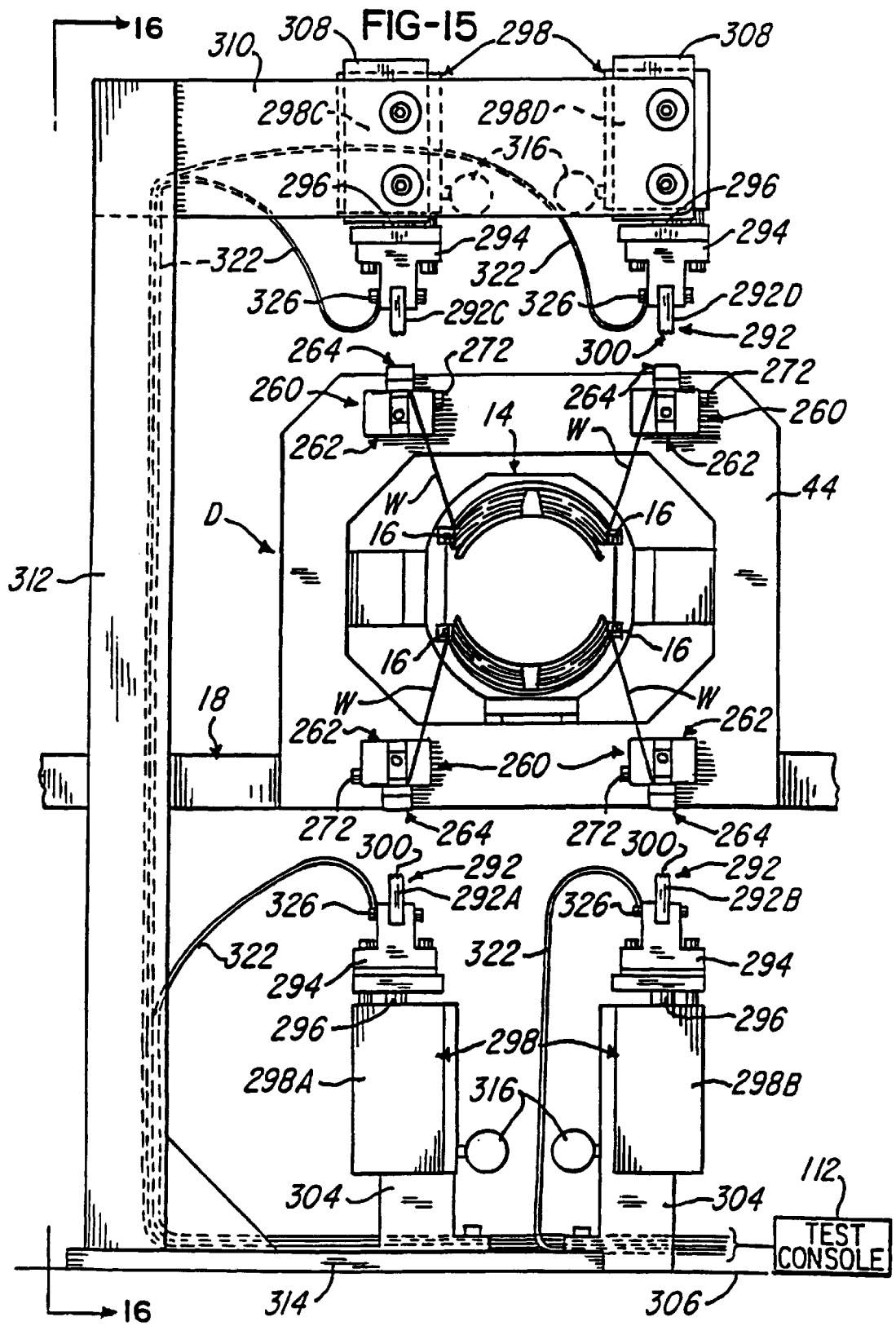

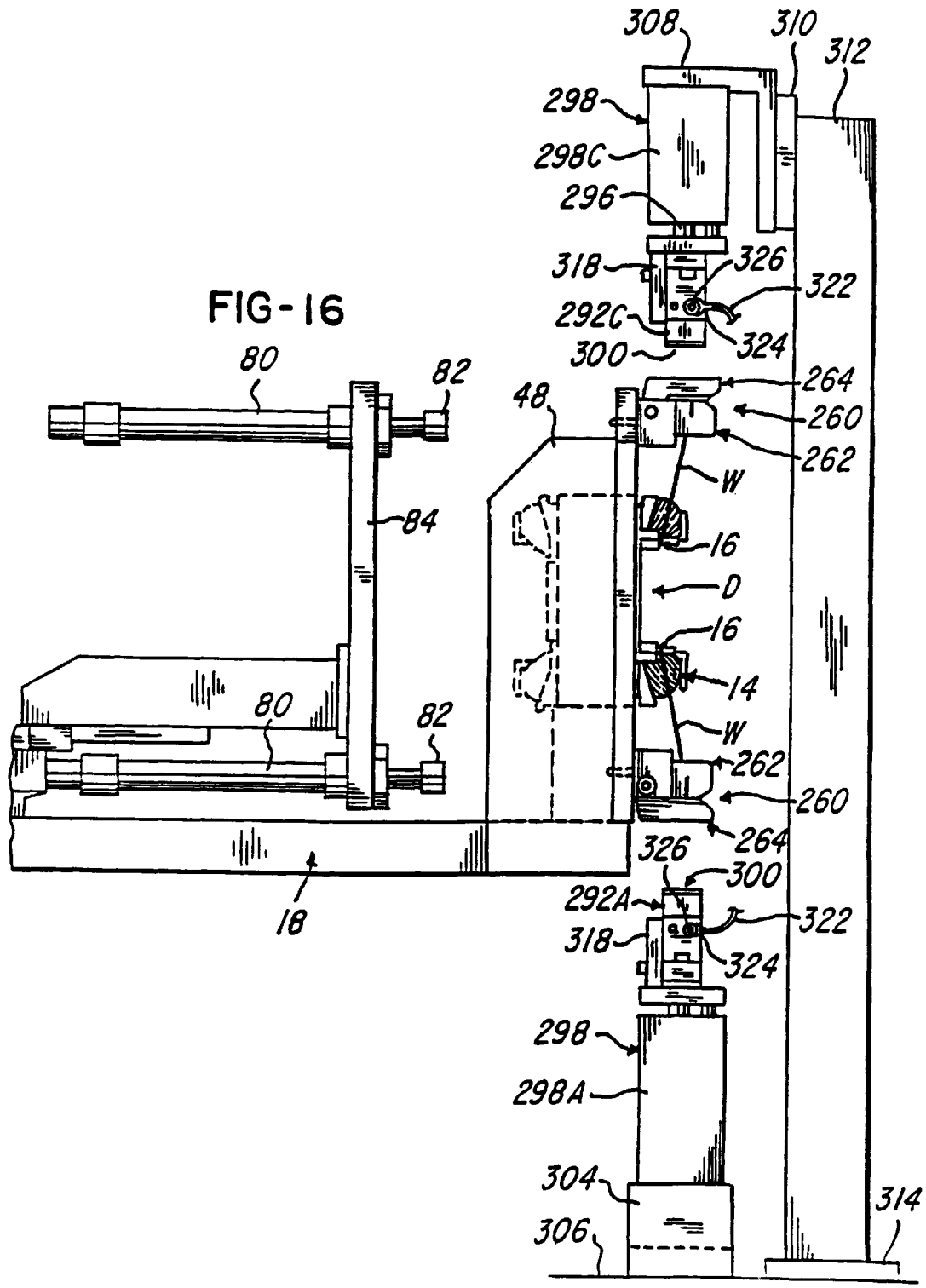

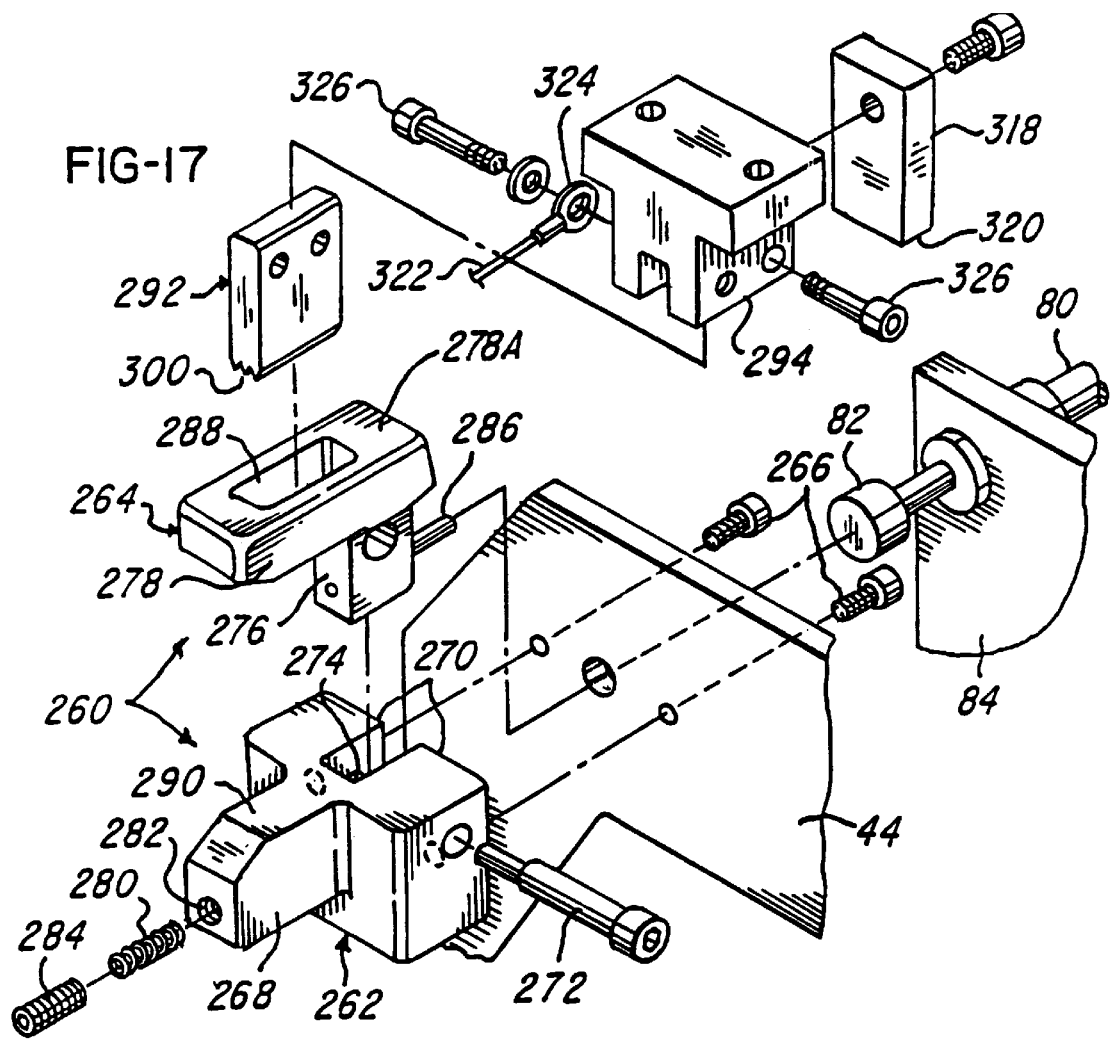
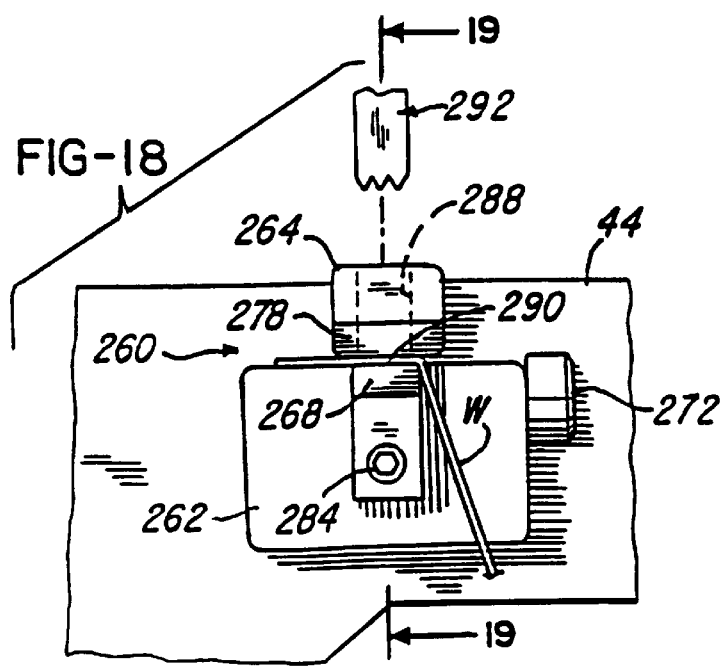

under STATOR MANUFACTURING AND TESTING
METHOD AND APPARATUS

CROSS-REFERENCE TO RELATED APPLICATIONS

This is the national stage of International Application PCT/US95/03052, filed Mar. 14, 1995, which was a continuation-in-part of both co-pending U.S. application Ser. No. 08/212,262, filed Mar. 14, 1994, now abandoned, and co-pending U.S. application Ser. No. 08/359,455, filed Dec. 19, 1994, now abandoned.

BACKGROUND

1. Field of Invention

This invention relates to a stator manufacturing and testing method and apparatus. This invention is especially adapted for the manufacture and testing of 2-pole stators for electric motors or other electrical devices, but aspects of this invention may be applicable to other manufacturing methods and apparatus.

2. Prior Art and Other Considerations

Modern stator manufacturing production lines include several different stations at which different manufacturing operations are performed. One such operation that is frequently accomplished at an early stage in the process for manufacturing a 2-pole stator is to assemble stator coil terminals or supports therefor on an unwound stator core. Thereafter, the stator coils are wound on the stator core pole pieces at a stator winding station using magnet wire having an electrically insulating coating. A common practice in use at this time is to temporarily clamp the stator coil lead wires to wire clamps during the winding process. At a later stage, the lead wires are connected to the terminals mounted on the stator core. Usually at a still later stage in the manufacture of the stator, the stator coils are tested for continuity and resistance.

One type of stator manufacturing machine, known as a turret winder, such as the machine 50 disclosed in Beakes et al. U.S. Pat. No. 5,186,405, granted Feb. 16, 1993, the disclosure of which is hereby incorporated by reference herein, includes a turret by which unwound stators having cores on which terminal members have previously been assembled are moved to a stator winding station at which the stator coils are wound and by which the freshly wound stators are then moved to a lead connect station at which the stator coil lead wires are connected to the terminal members on the core. The coil winding process typically requires more time to complete than do the lead wire connecting operations or the testing operations. It has been suggested that there would be an advantage to testing the coils of each stator for resistance and shorts while the stator is still located on the turret of a turret winder. If the stator coils are tested immediately after being wound, the winding machine operations can be immediately halted in the event a stator fails a test procedure so that the condition which caused the failure can be promptly cured. This would avoid the possibility that a substantial number of similarly defective stators are wound before the defect is discovered.

SUMMARY

This invention provides a stator manufacturing and testing method and apparatus by which stator coils can be electrically tested immediately after they are wound. If a test indicates a defective stator, further processing can be interrupted until the defective condition is determined and appropriate remedial action taken.

An object of this invention is to provide a stator manufacturing and testing method and apparatus in which the stator coil lead wires having an electrically insulating coating are connected to temporary wire clamps at a winding station and in which the stator coils are electrically tested, such as for resistance and shorts, before the coil lead wires are removed from the temporary clamps.

In accordance with one aspect of this invention, the clamps each include a jaw formed with a wire-engaging surface, preferably a knife edge, which scrapes the insulating coating from a lead wire as it is inserted therein. The clamps are mounted on an electrically insulating support and are electrically connected to terminal members which are engageable by electrical test terminal members. In a modification, the wire-scraping or cutting jaw has, in addition to a body formed with a sharpened or knife edge, a wire-guiding shield having surfaces engageable by a lead wire being inserted into the clamp. The wire-guiding surfaces are located immediately adjacent the knife edge and are so positioned that the depth of the insulated wire scraped or cut away by the knife edge is only a few thousandths of an inch.

In the presently preferred practice of this embodiment of a clamp jaw having a wire-guiding shield, the wire-guiding surfaces of the shield are located on both sides of the tip of the knife edge to limit the depth by which the knife edge cuts into the magnet wire metal. Also, for ease of manufacture, the shield is preferably formed separately from the clamp jaw body and is formed in two pieces which are clamped together and to the jaw body. In a further modification, the wire-guiding shield may be made in one piece, is slidably received over the clamp jaw body, and is connected by a screw to the clamp jaw body.

Although the foregoing embodiments of this invention may be useful in many applications for testing stators before their lead wires are released from clamps in preparation for further processing, there are conditions in which the foregoing embodiments may not be entirely reliable. For example, atmospheric conditions in some manufacturing plants are such that electrical contact terminals become coated with an oily film that interferes with the ability to obtain consistently good electrical contact between terminal members. There are also certain types and sizes of magnet wires from which stator coils and lead wires are made that are damaged by practice of the foregoing methods and apparatus, or else do not provide a good electrical contact with the clamp jaw that scrapes the insulation therefrom. Accordingly, in another aspect of this invention, the clamp jaws are formed to clamp the lead wires without scraping insulation from them. Electrical connections are made between the clamped lead wires and the test console by means of electrically conductive, insulation-piercing test probes that, in the preferred embodiment of this invention, are directly wired to the test console. Each test probe is driven by a suitable actuator through an opening in one of the clamp jaws into engagement with a portion of the lead wire engaged with the other clamp jaw.

Other features and advantages of this invention will become apparent from the following description of the drawings.

BRIEF DESCRIPTION OF THE DRAWINGS

FIG. 1 is a partially diagrammatic, fragmentary, perspective view of portions of a stator manufacturing and testing apparatus in accordance with this invention.

FIG. 2 is an enlarged, partially exploded, fragmentary perspective view of a portion of the apparatus shown in FIG. 1.

FIG. 3 is a fragmentary front elevational view of parts of the apparatus illustrated in FIG. 2 shown engaged with a stator coil lead wire.

FIG. 4 is a fragmentary side elevational view of the parts shown in FIG. 3. Portions of FIG. 4 are shown in vertical cross section along line 4—4 of FIG. 3.

FIG. 5 is a fragmentary cross sectional view similar to FIG. 4 but with parts shown at a stage of operation of the apparatus different from that illustrated by FIG. 4.

FIG. 6 is a fragmentary side elevational view, with parts in cross section, of another portion of the apparatus shown in FIG. 1. FIG. 6 shows the parts as if viewed in the direction of arrows 6—6 of FIG. 1 and along the section indicated thereby. FIG. 6 further includes a phantom line representation of a moved position of a tester terminal block forming part of this invention.

FIG. 7 is an enlarged, partially exploded, fragmentary perspective view similar to FIG. 2 illustrating a modified temporary wire clamp in accordance with the present invention.

FIG. 8 is a fragmentary front elevational view of parts of the temporary wire clamp of FIG. 7 shown engaged with a stator coil lead wire.

FIG. 9 is a fragmentary side elevational view of the parts shown in FIG. 8. Portions of FIG. 9 are shown in vertical cross section along line 9—9 of FIG. 8.

FIG. 10 is a fragmentary cross sectional view similar to FIG. 9 but with parts shown at a stage of operation of the apparatus different from that illustrated by FIG. 9.

FIG. 11 is an enlarged, partially exploded, fragmentary perspective view illustrating a second embodiment of a temporary wire clamp in accordance with the present invention.

FIG. 12 is a plan view of a wire-guiding shield forming part of the temporary wire clamp of FIG. 11.

FIG. 13 is a side elevational view of the wire-guiding shield of FIG. 11.

FIG. 14 is an end elevational view of the wire-guiding shield of FIG. 11.

FIG. 15 is a fragmentary, partly diagrammatic elevational view of a stator winding apparatus.

FIG. 16 is a fragmentary, elevational view of a portion of the apparatus of FIG. 15 viewed in the direction of arrows 16—16 of FIG. 15.

FIG. 17 is an enlarged, partially exploded, fragmentary perspective view of a portion of the apparatus shown in FIG. 15.

FIG. 18 is a fragmentary front elevational view of parts of the apparatus illustrated in FIG. 17 shown engaged with a stator coil lead wire.

DETAILED DESCRIPTION OF THE DRAWINGS

Figure 19:
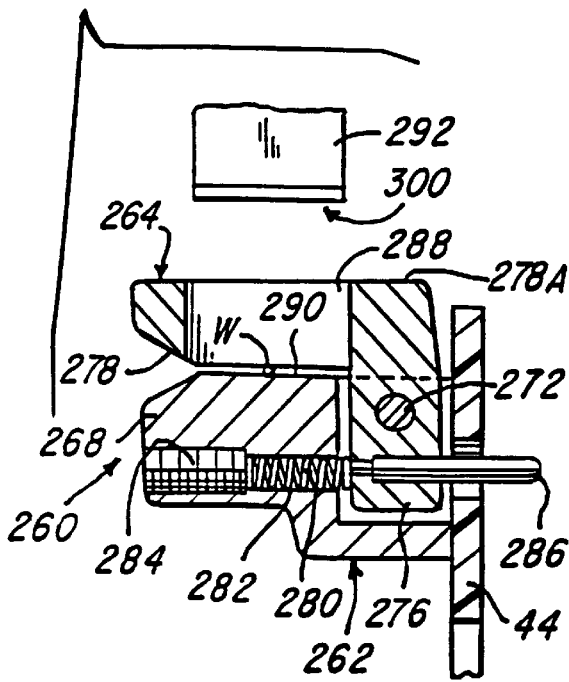
FIG. 19 is a fragmentary side elevational view of the parts shown in FIG. 18. Portions of FIG. 19 are shown in vertical cross section along line 19—19 of FIG. 18.
Figure 20:
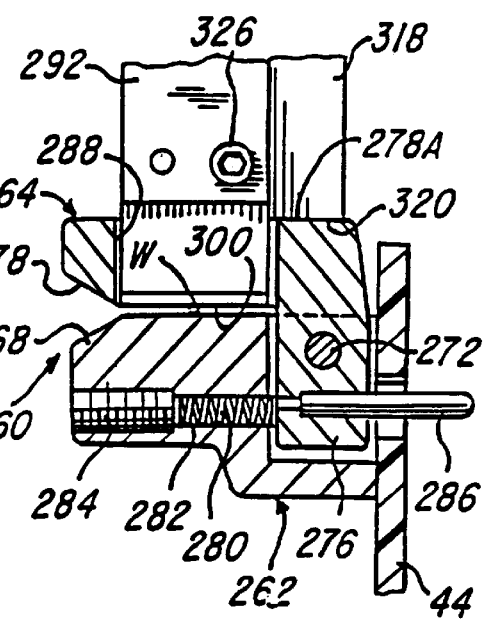
FIG. 20 is a fragmentary side elevational view similar to FIG. 19, but showing the parts at a different stage of operation.

With reference to FIG. 1, the stator manufacturing and testing apparatus of this invention is generally designated 10 and is used to wind coils 12 formed from insulated magnet wire onto a 2-pole stator 14, to test the coils 12 and their lead wires W, and to connect the lead wires W to stator terminals or stator terminal supports 16 mounted on the stator cores. All of the operations of the apparatus 10 are synchronized and controlled by suitable machine controls, diagrammatically illustrated in FIG. 1. Such controls are known, may be conventional, and are not further described herein.

Apparatus 10 includes a turret plate 18 mounted for rotation about a vertical axis 20 and repeatedly rotationally indexed through successive 90 degree increments in one direction, as indicated by the arrow 22, about its vertical axis 20 by a suitable indexing drive motor 24. Stators to be wound are clamped to an individual one of four stator support and clamp mechanisms, generally designated 26, to which they remain clamped throughout a complete cycle of operation of the apparatus of winding, testing, and lead connecting operations.

The four stator clamp mechanisms 26 are connected to the turret plate 18 at 90 degree spaced locations so that, in operation, after each 90 degree index of the turret plate 18, there will be a clamp mechanism 26 at each of four stations, namely a load/unload station A, an idle station B, a winding station C, and a coil lead terminating station D. At each of the stations, the stators are positioned with their center axes extending horizontally and substantially perpendicularly with respect to the vertical axis 20 of the turret plate 18 and with the end faces of the stators most remote from the vertical axis 20 in vertical orientations and spaced a fixed horizontal distance from the vertical axis 20 of the turret plate 18.

At the load/unload station A, a newly wound stator 14 is unclamped from its support and clamp assembly 26, removed from the turret plate 18, and replaced by an unwound stator 14. No operations are performed on the stator at the idle station B. At the winding station C, a pair of stator coils are wound by the operation of a winding head 30 located adjacent the winding station C that has a reciprocating and oscillating shuttle or ram 32 that draws wires from sources (not shown) of wire under tension and having wire guide needles 34 through which the wires exit as the coils are wound. The winding shuttle or ram 32 reciprocates and oscillates about a fixed horizontal axis in order to wind coils of wire around the stator pole pieces in a manner well known in the art.

At or about the time of the commencement of the winding of a pair of coils 12, the stator lead wires, known as "start wires," are inserted into a pair of temporary wire clamps 36 by the operation of a pair of movable wire grippers 38, which are preferably of the type shown in said U.S. Pat. No. 5,186,405. At the conclusion of the winding operation, the wire portions leading from the coils to the winding shuttle 32 are gripped by the wire grippers 38 to form coil finish lead wires extending from the coils 12, which are then positioned in other ones of the wire clamps 36. Wire cutting mechanisms associated with the wire grippers 38 cut the finish leads free from the wire grippers 38 so that the newly wound stator 14 is completely free from the winding shuttle 32. The wound stator 14 is then indexed by rotation of the turret plate 18 to the wire terminating station D at which the stator is electrically tested and the start and finish leads are removed from the wire clamps 36 and at least temporarily connected to terminals on the stator 14 by a robot 40 having a wire-gripping and manipulating end effector 42. The robot 40 may also be conventional and is not further described herein. Thus it may be seen that, when the newly wound stator returns to the load/unload station A, it may be simply unclamped from the turret plate 18 and removed. The foregoing operations are repeated to continuously wind stators.

At each turret station, the temporary wire clamps 36 are mounted on a clamp mounting plate 44 made from an insulating material, such as a phenolic resin or other plastic material, and which in turn is mounted on the outwardly facing edge surfaces of a mutually-spaced pair of support plates 46 and 48 affixed to the turret plate 18 by screws 50. The support plates 46 may be referred to as the leading plates with reference to the direction of rotation of the turret plate 18 indicated by the arrow 22.

With reference to FIGS. 2 through 5, each temporary wire clamp 36 includes a pair of wire clamp members, namely a fixed clamp member 52 and a movable or pivotal clamp member 54. The pivotal clamp member 54 and, optionally, the fixed clamp member 52, are made from a hardened tool steel or other suitable electrically conductive material. Fixed clamp member 52 is fixedly mounted on the clamp mounting plate 44 by screws 56 and comprises a body member having a horizontal jaw 58 and a bifurcated portion abutting the clamp mounting plate 44 that forms a clevis yoke 60 through which a clevis pin 62 extends. Clevis pin 62, which may simply be a shoulder screw, has a threaded end engaged in a tapped hole 64 in one of the bifurcations of the clevis yoke 60. The pivotal clamp member 54 comprises an L-shaped body member having a generally vertical leg 66 pivotally supported by the clevis pin 62. Pivotal clamp member 54 further includes a generally horizontal, movable clamp jaw 68 that confronts the fixed clamp jaw 58.

A clamp spring 70 is mounted partly within in a through bore 72 in the fixed clamp member 52 and has one end which bears against the outwardly facing surface of the vertical leg 66 of the pivotal clamp member 54. The other end of the clamp spring 70 abuts against the inner end of a retaining screw 74 which is located in the tapped, outer end of the through bore 72. Clamp spring 70 is under compression so that it pushes against the vertical leg 66 of the pivotal clamp member 54, which causes the pivotal clamp jaw 68 to be pressed against the fixed jaw 58. Accordingly, a lead wire W inserted between the fixed jaw 58 and the movable jaw 68 will be securely clamped between the jaws 58 and 68, as is shown in FIG. 4.

With reference to FIGS. 4 and 5, in order to release the clamped wire from a temporary clamp 36, a release pin 76 is fixed in the vertical leg 66 of the pivotal or movable clamp member 54 and extends rearwardly completely through and beyond a through bore 78 in the clamp mounting plate 44. An air operated clamp release actuator 80 is energized to extend a fitting 82 at the end of its piston rod into engagement with the rearwardly projecting end of the release pin 76 and thereby overcome the bias of the clamp spring 70 and reversely pivot the pivotal clamp member 54 so that its jaw 68 moves away from the fixed jaw 58 as shown in FIG. 5. For reasons which will become apparent, the piston rod fitting 82 is preferably made from a plastic insulating material or else has an insert (not shown) made of such material that engages the release pin 76 so that there can be no accidental electrical connection between the release pin 76 and the clamp release actuator 80.

As shown in FIG. 1, there are four clamp release actuators 80, one for each temporary clamp 36, mounted on a vertical support plate 84 that is fixed and does not rotate with the turret plate 18. Therefore, the clamp release actuators remain adjacent the testing and lead wire connect station D at all times. Here it may be noted that there are occasions when more than four temporary clamps 36 may be used, particularly for stators having coils with intermediate taps. As is obvious, there would then be more than four clamp release actuators 80.

The confronting surfaces of the fixed clamp jaw 58 and the movable clamp jaw 68 are contoured not only to firmly grip the lead wire segments W but also to scrape away the insulating coating on the lead wires as they are inserted therein. By scraping away the insulation in this manner, an electrical connection is formed between each lead wire and its associated pivotal clamp member 54. With continued reference to FIGS. 2 through 5, the mutually confronting surfaces of the fixed clamp jaw 58 and the movable clamp jaw 68 are contoured to have beveled outer ends by which the lead wire segments W are guided therebetween as a result of the movements of the lead wire grippers 38. In addition, the fixed clamp jaw 58 has a shallow, longitudinally-extending groove 86 confronting the pivotal jaw 68 and the pivotal jaw 68 has beveled side faces that join at a longitudinally-extending knife edge 88 that confronts the center of the shallow groove 86 in the fixed clamp jaw 58. As a result of this construction, the insulating coating on a lead wire is stripped away by the knife edge 88 as the lead wire is being inserted between the clamp jaws 58 and 68 by operation of the wire grippers 38 into the position illustrated in FIGS. 3 and 4. Here, it may be noted as apparent that the clamp springs 70 must be sufficiently strong to hold the pivotal clamp jaws 54 in position to effect the scraping away of the insulating coating on the lead wires as described above.

Further in accordance with this invention, as best illustrated in FIGS. 1, 2, 3 and 6, each pivotal clamp jaw 68 is electrically connected to an electrical terminal member 90 mounted on a terminal block 92 which itself is mounted on the associated leading support plate 46. Such electrical connection is provided by means of an insulated connector wire 94 connected at one end to a mounting screw 96 projecting from the pivotal clamp and connected at its other end to the terminal member 90. Terminal member 90 may conveniently comprise a brass screw, the head 98 of which has been faced off flat. Terminal screw head 98 projects out the front side of terminal block 92 so that it can be engaged by a cooperating tester terminal member 100 aligned therewith. Insulated connector wires 94 are clamped to the mounting plate 44 by suitable clips 102 and extend through to the backside of the mounting plate 44 and around the top rear of the mounting plate 44 to their associated clamp terminals 90 on the terminal block 92.

With reference to FIG. 1, there is one tester terminal member 100 aligned with each of the clamp terminal members 90. Tester terminal members 100 are preferably made from square brass rod material and are held within square bores in the front and rear walls of a tester terminal housing 104 so that they cannot rotate. An intermediate portion of each tester terminal member 100 is grooved for connection of a suitable retaining ring 106, such as an e-ring or a c-clip, thereto and is surrounded by a coil spring 108. All of the retaining rings 106 and the coil springs 108 are located within a hollow compartment 110 within the tester terminal housing 104 with the springs 108 placed under compression so that the retaining rings 106 and, accordingly, the tester terminal members 100 are biased toward the clamp terminal members 90. Therefore, the tester terminal housing 104 can be advanced, as will be described below, toward the clamp terminals 90 to the point at which the tester terminal springs 108 are further compressed so that good electrical contact is effected between the clamp terminals 90 and the tester terminals 100. The ends of the tester terminals 100 are connected by connector wires 111 to an electric test console 112 which performs such electrical tests on the coils 12 and their lead wires as are desired. Preferably such tests are carried out automatically and, in the event of a failure, operation of the winding and testing apparatus 10 is interrupted until the problem which caused the test failure can be cured. The nature of the tests and the mechanical and electronic construction of the test console 112 may be conventional and form no part of this invention. Assuming the test results are acceptable, the tester terminal housing 104 is retracted from the turret 18, causing a disconnection of the tester terminals 100 from the clamp terminals 90, and the robot 40 is then energized to effect connection of the coil lead wires to the terminals or terminal supports 16.

The tester terminal housing 104 is mounted on a stanchion 114 projecting upwardly from an L-shaped, tooling support arm 116 which is driven toward and away from the turret plate 18 in order to effect electrical connection and disconnection of the tester terminal members 100 with the clamp terminals 90 by means of a tooling positioning actuator 118, which is preferably a double-acting linear air actuator, mounted on an immovable support member 120. A second air actuator 122 is shown mounted on the immovable support member 120. It can be used to prevent over travel or to reversely position the tooling support arm 116, and is not essential to the operation of the apparatus of this invention.

To reduce the load on the tooling actuator 118, the stanchion 114 and its support arm 116 are preferably made from aluminum or other lightweight metal. To resist damage to the aluminum material, a steel insert (not shown) can be mounted in the support arm 116 aligned with the piston rod of the second air actuator 122 in the event the latter actuator 122 may be used to position the support arm 116. The support arm 116 can be connected by screws (not shown) to a mounting plate 124 connected to the piston and guide rods projecting from the tooling 118. To resist having the support arm 116 twist or sag, it preferably is formed with a channel in which the mounting plate 124 is snugly received.

While the electrical connections between the clamps and the test console described above are presently preferred, it will be apparent that different electrical connections, such as pin and socket connectors (not shown), could be used to connect the wire leads of the tester console to the wire leads from the clamps.

The method and apparatus described above may be satisfactorily used in many applications. However, there are applications in which a lead wire is cut so deeply by the wire-scraping or knife-edged jaw 68 that the lead wire is unduly weakened and may break because the depth of the wire W cut into by the knife edge 88 is essentially uncontrolled. This problem may be understood with reference to FIG. 3. As a wire gripper 38 (FIG. 1) is moved to place the lead wire W illustrated in FIG. 3 into the temporary wire clamp 36 shown therein, the segment of the lead wire W leading from the stator coil (not shown), i.e. from the right as viewed in FIG. 3, is at an acute angle relative to the horizontal plane of the knife edge 88. Accordingly, as the lead wire W is pulled across the knife edge 88, a substantial part of the lead wire metal is cut or scraped away in addition to its insulating coating. Cases can arise in which the amount of the lead wire metal cut away by the knife edge 88 is intolerable because the lead wire is either broken or severely weakened.

It may appear that the problems caused by the uncontrolled cutting into the lead wire W may not be so great if the wire clamp 36 shown in FIG. 3 were in a rotated orientation in which the movable clamp member 54 is located above the fixed clamp member 52 because the segment of the wire W leading from the stator coil (not shown) to the right of the clamp 36 would be coursed over the fixed clamp member 52 and would not approach the knife edge 88 at an acute angle. However, it is usually necessary to so manipulate the wire gripper 38 when it inserts the lead wire W into the clamp 36 so as to pull upwardly (as viewed in FIG. 3) on the end segment of the lead wire W past the clamp 36, i.e. to the left of the wire clamp 36 as viewed in FIG. 3. Such upward pulling on the end segment of the lead wire W can also cause a gouging of the knife edge 88 into the lead wire W to an essentially uncontrolled depth.

In accordance with a first, and preferred, embodiment of this aspect of the invention illustrated in FIGS. 7 through 10, the amount of the lead wire metal cut or scraped away from the lead wire W by the knife edge 88 is kept within tolerable limits by means of modified temporary wire clamps, generally designated 136. Only one modified temporary wire clamp 136 is illustrated, but it will be understood that there will usually be four or more clamps 136 mounted on the clamp mounting plate 44, for reasons discussed above with reference to the wire clamps 36. In FIGS. 7 through 10, parts that may be identical to corresponding parts of the apparatus disclosed in connection with FIGS. 1 through 6 are given like reference numbers.

The modified wire clamp 136 may comprise the same parts and construction of the temporary wire clamp assembly 36 illustrated in FIGS. 2 through 5, including the fixed clamp member 52 and the movable or pivotal clamp member 54 which is biased by a clamp spring 70. In addition to such parts, this invention provides a wire-guiding shield assembly, generally designated 138, which is mounted on the body of the horizontal, knife-edged, movable jaw 68 of the movable clamp member 54, and effectively becomes part of the movable jaw 68. Wire-guiding shield assembly 138 comprises two mutually identical shield pieces 140 and 142, each of which includes a vertical mounting plate 144 and a shield plate 146 that is angled relative to vertical. Each mounting plate 144 has a tapped bore 148 and an untapped bore 150. Shield assembly 138 is assembled together and clamped onto the movable clamp jaw 68 by abutting the two mounting plates in face-to-face relationship with the tapped bore 148 of one plate aligned with the untapped bore 150 of the other plate, and vice versa. When the shield pieces 140 and 142 are so oriented, a channel 152 is formed between the respective shield plates 146 which clampingly receives the body of the movable clamp jaw 68. The two mounting plates 144 are then clamped together and held to the body of the movable clamp jaw 68 by a pair of screws 154 which are engaged within respective ones of the confronting bores 148 and 150. When the shield assembly 138 is mounted on the body of the movable clamp jaw 68, the free end surfaces, designated 156, of the shield plates 146 face the fixed jaw 58 and constitute wire-engageable surfaces that extend beside said beveled side faces of the body of the movable jaw 68 and limit the depth of the body of the movable jaw 68 exposed to be engaged by the magnet wire W and thereby the extent to which the knife edge 88 can cut into the coil lead wire W while it is being inserted into the temporary clamp 136.

It will be noted in FIG. 8 that the lead wire W shown in full lines approaches the wire clamp 136 from the wound coil at an acute angle to horizontal but is bent around the right side (as viewed in FIG. 3) shield plate 146 over its wire-engageable surface 156 and enters the gap between the knife edge 88 and the confronting groove 86 along a horizontal path which is nearly coplanar with the knife edge 88. The end segment of the lead wire W past the wire clamp 136 is bent away from the knife edge 88. Accordingly, the amount of the lead wire W scraped away from the wire W is effectively limited to the depth of the portion of the movable jaw 68 immediately below the knife edge 88 that is exposed by the shield assembly 138. The insulating coating on magnet wire used for winding 2-pole stators is on the order of 0.001 inch. To insure that good electrical connection is obtained between the movable jaw 68 and the lead wire W, the depth of the sloping surfaces of the body of the movable jaw 68 exposed below the knife edge 88 is preferably 0.007 inches but could be more or less. Generally, such depth may be between 0.003 inch and 0.010 inch, but a greater depth may be tolerable for relatively large diameter wires.

FIG. 8 has been described above as if it represents a wire clamp 136 located at the upper left of clamp mounting plate 44. However, FIG. 8 could also represent a clamp 136 which has been oriented so that its fixed clamp member 52 is closer to the stator being manufactured than its movable clamp member 54. In such event, except for the lead wire W represented by full lines in FIG. 8, FIG. 8 could represent a clamp 136 located at the lower left corner of the clamp mounting plate 44. The lead wire would then extend downwardly to the left from the stator coil (not shown) to the temporary clamp 136, as indicated by the lead wire W1 shown in dotted lines in FIG. 8, and pass along the downwardly facing surface of the fixed jaw 58 to the knife edge 88. As the lead wire W1 enters the gap between the jaws 58 and 68 and is pulled across the knife edge 88 and downwardly to the left, it is held upwardly by the upwardly facing surface 156 of the left side shield plate 146. Accordingly, the left side guide plate 146 shields the sloping body of the movable jaw 68 and prevents the knife edge 88 from cutting too deeply into the wire W1 in those cases in which FIG. 8 represents a clamp 136 at the lower left corner of the clamp mounting plate 44.

A portion of a second embodiment of a temporary wire clamp, generally designated 236, is illustrated in FIGS. 11 through 14. As in the case of the temporary wire clamp 136 described with reference to FIGS. 7 through 10 above, the clamp 236 may be identical to the wire clamp 36 shown in FIGS. 2 through 5 except for the addition of a wire shield assembly, generally designated 238. Because the clamp 236 of FIGS. 11 through 14 is otherwise the same as the clamp 36 of FIGS. 2 through 5, only the movable clamp member 54 and the shield assembly 238 are illustrated in FIGS. 11 through 14. It is to be understood that the remainder of the clamp 236 is substantially identical, and may be entirely identical, to the clamp 36 of FIGS. 2 through 5.

In contrast to the shield assembly 138 of FIGS. 7 through 10, the shield assembly 238 is made in one-piece and has a pair of shield plates 240 which form a channel 242 therebetween that slidably receives the pivotal jaw 68. Shield plates 240 are connected to a mounting plate 244 having a bore 246 adapted to be aligned with the same bore, designated 248, in the movable clamp member 54 that receives the mounting screw, designated 250, by which the terminal connector of the connector wire 94 is also connected to the movable clamp member 54. It will be appreciated that the shield assembly 238 of the second embodiment performs exactly the same purposes as the shield assembly 138 illustrated in FIGS. 7 through 10.

As previously explained, use of a clamp jaw to scrape away wire insulation and provide electrical connection to the test console is unsatisfactory under certain conditions. Apparatus in accordance with another aspect of this invention is illustrated in FIGS. 15 through 22 which will often provide better reliability. The apparatus illustrated in FIGS. 15 through 22 includes some of the same parts illustrated in FIGS. 1 through 14, and these parts are given the same reference numbers in all of the figures. Unless otherwise indicated or made apparent from the context, parts given the same reference numbers are constructed and operate the same as the corresponding parts described above.

Briefly, in accordance with this aspect of the invention, there are four temporary wire clamps, generally designated 260 mounted on a clamp mounting plate 44. With reference to FIGS. 15 through 21, each temporary wire clamp 260, includes a pair of wire clamp members, namely a fixed clamp member 262 and a movable or pivotal clamp member 264, both of which may be made from a hardened tool steel or other suitable material. Fixed clamp member 262 is fixedly mounted on the clamp mounting plate 44 by screws 266. For reasons which will become evident, in the particular embodiment illustrated in FIGS. 15 through 21, the temporary wire clamps 260 are oriented on the mounting plate 44 such that the fixed clamp members 262 are closer to the stator than the movable clamp members 264. Fixed clamp member 262 comprises a body member having a horizontal clamp jaw 268 and a bifurcated portion abutting the clamp mounting plate 44 that forms a clevis yoke 270 through which a clevis pin 272 extends. Clevis pin 272, which may be a shoulder screw, has a threaded end engaged in a tapped hole 274 in one of the bifurcations of the clevis yoke 270. The pivotal clamp member 264 comprises an L-shaped body member having a generally vertical leg 276 pivotally supported by the clevis pin 272. Pivotal clamp member 264 further includes a generally horizontal, pivotable clamp jaw 278 that confronts the fixed clamp jaw 268.

A clamp spring 280 is mounted partly within in a through bore 282 in the fixed clamp member 262 and has one end which bears against the outwardly facing surface of the vertical leg 276 of the pivotal clamp member 264. The other end of the clamp spring 280 abuts against the inner end of a retaining screw 284 which is located in the tapped, outer end of the through bore 282. Clamp spring 280 is under compression so that it pushes against the vertical leg 276 of the pivotal clamp member 264, which causes the pivotal clamp jaw 278 to be pressed against the fixed jaw 268. Accordingly, a lead wire W inserted between the fixed jaw 268 and the movable jaw 278 will be securely clamped between the jaws 268 and 278, as is shown in FIG. 18. A release pin 286 is fixed in the vertical leg 276 of the pivotal clamp member 264 and extends rearwardly completely through and beyond a through bore 78 in the clamp mounting plate 44. Release pin 286 serves the same jaw-opening purpose as the release pin 76 described above and is used with a clamp release actuator 80 to overcome the bias of the clamp spring 280 and reversely pivot the pivotal clamp member 264 so that its pivotal jaw 278 moves away from the fixed jaw 268. As before, there are four clamp release actuators 80, one for each temporary clamp 260.

In the embodiment illustrated in FIGS. 15 through 21, an opening or window 288 extends all of the way through the movable clamp jaw 278 and exposes the outwardly-facing surface, designated 290, of the fixed jaw 268. Temporary clamp 260 is mounted on said clamp mounting plate 44 in a position such that window 288, when a lead wire W is inserted and clamped between the jaws 268 and 278, also exposes a stretch of the lead wire W clamped to the outwardly-facing surface 290 of fixed jaw 268. But for the window 288, the confronting faces of the clamp jaws 268 and 278, including the outwardly-facing surface 290, are essentially planar with bevelled edges.

Figure 21:
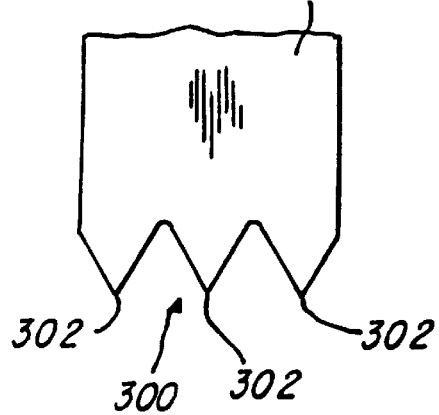
FIG. 21 is an enlarged, fragmentary elevational view of a probe forming part of the apparatus of FIG. 15.

A lead wire W gripped by a temporary wire clamp 260 is connected to the test console 112 by means of a probe 292, which is made from a hardened tool steel or other suitable electrically conductive material and which is in the form of a rectangular plate connected by a fitting 294 to a piston rod 296 of a double-acting air actuator 298. Each probe 292 has a width and depth in horizontal cross section such that it can enter the window 288 in the associated fixed jaw 268 without interference so that its free end face, designated 300, can extend through the window 288 into engagement with a stretch of a lead wire spanning the window 288. When the probe 292 engages the lead wire, the exposed surface of the fixed jaw 268 serves as an anvil that so that the lead wire is trapped between such surface and the probe 292. As shown in FIG. 21, the wire-engaging free end face 300 has three, mutually parallel knife edges 302 extending along the entire width of the probe 292. (Of course, there could be a different number of knife edges depending upon the thickness of the probes 292 and the manufacturing process used to form the knife edges 302.) When the air actuator 298 is actuated to move the probe 292 toward the fixed jaw 268, the knife edges 302 pierce through the insulating coating of the stretch of a lead wire spanning the window 288 and thus make good electrical contact with the central metal portion of the lead wire.

There are four air actuators, one for each temporary wire clamp 260, comprising two lower actuators 298A and 298B mounted beneath the turret 18 by supports 304 to a machine frame 306 which may be the bed of the apparatus 10, and two upper actuators, 298C and 298D mounted above the turret plate 18 and the tops of the mounting plates 44 by brackets 308 to a horizontal support arm 310 affixed to the upper end of a stanchion 312 supported by a base plate 314 on the machine frame 306. Two lower probes 292A and 292B, respectively, are connected to lower actuators 298A and 298B. Likewise, two upper probes 292C and 292D, respectively, are connected to upper actuators 298C and 298D. The actuators 298 are so mounted that the probes 292 connected thereto are vertically aligned with their respective temporary clamps 260, and more precisely, the windows 288 in the movable clamp jaws 278.

In usual cases, the probe knife edges 302 can penetrate insulating coatings on magnet wire at a lower pressure than they can significantly penetrate the underlying copper. Accordingly, the depth with which the knife edges 302 penetrate the clamped stretches of lead wire is controlled by regulating the air pressure applied to the actuators 298 to a pressure sufficient to cause the knife edges 302 to penetrate the insulating coatings but low enough to avoid having the knife edges penetrate deeply into the copper wire core. Accordingly, a separate pressure regulating valve 316 is provided between the source of air under pressure and each of the actuators 298. Wires made to different specifications may require different pressures to be penetrated by the knife edges. Even magnet wires which appear to be made to identical specifications but which are obtained from different wire manufacturers may have significantly different characteristics, including resistance to penetration. Therefore, the pressure regulating valves 316 are adjustable so that they can be set up for different wires that may be used.

Other controls can be used to prevent undue penetration into the lead wires. Thus, a stop plate 318 is mounted on each of the fittings 294. Each stop plate 318 is so located that its surface, designated 320, confronting its associated wire clamp 260, will engage and be stopped by the confronting surface 278A of the associated movable clamp jaw 278 to prevent excessive penetration of the lead wires by the associated probe 292. In practice, stop plates 318 are preferably made somewhat oversized and are not connected to the fittings 294 unless needed. If they are needed, the person assembling the stop plates 318 will grind them to the appropriate size so that they will accurately stop the wire-penetrating movements of the probes 292 at the desired degree of penetration.

Figure 22:
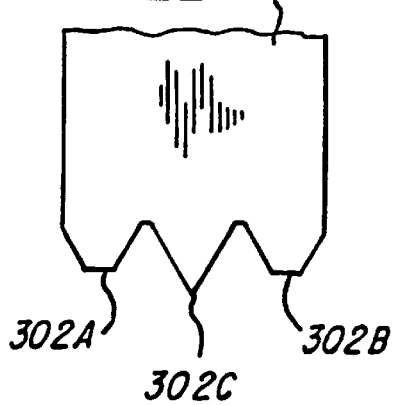
FIG. 22 is an enlarged, fragmentary elevational view similar to FIG. 21 of a probe which has been modified.

Each probe 292 is preferably provided with more than one knife edge 302 to decrease the possibility that the probe 292 will fail to make good electrical contact with the clamped lead wire. However, a single knife edge 302 could be sufficient. In the unlikely event a situation is encountered in which regulation of the pressure used to actuate the actuators 298 is ineffective to prevent excessive penetration of the lead wires by the knife edges 302, the probes 292 could be modified as shown in FIG. 22 by removing the tips of the two outer knife edges, designated 302A and 302B, so that only the center knife edge, designated 302C will penetrate the lead wires. In such case, the outer knife edges 302A and 302B will serve as stop surfaces which, upon engaging a clamped lead wire, will prevent deeper penetration of the center knife edge 302C into the lead wire.

Each of the probes 292 is connected by insulated conductor wires 322 directly to the test console 112 so that the electrical tests can be performed and the operation of the apparatus 10 interrupted automatically as described above in the event of the failure of a stator to pass a test. Connection of the conductor wires 322 to the probes 292 can conveniently be made, as illustrated, by connecting a terminal clip 324 at the end of each of the connector wires 322 to the screw, designated 326, by which the associated probe 292 is connected to the fitting 294 which connects the probe 292 to the actuator piston rod 296.

The method of operation is believed apparent from the foregoing description. When the turret plate 18 is indexed to bring a wound stator to the terminal connect station D, the actuators 298 are actuated to cause the knife edges 302 to penetrate the insulating coatings on the clamped stretches of the lead wires W. Upon such engagement, the electrical tests are performed after which the actuators are energized to retract the probes 292. If the tests results indicate that the stator windings are acceptable, the lead wires are connected to the terminals or terminal supports on the stator core. If the tests indicate that the windings are defective, a suitable alarm signal, whether visual, audio, or both, may be energized and, optionally, the operation of the apparatus 10 may be interrupted automatically so that problem can be investigated and corrective action taken.

It may be observed that the apparatus of FIGS. 15 through 22 embodies improvements over the apparatus of FIGS. 1 through 14 in that the depth of penetration of an electrically conductive probe 292, which moves perpendicularly to the lead wire, can be more accurately controlled than can the depth of penetration of a lead wire by a knife edge on a movable jaw. In the latter case, a lead wire is drawn across the knife edge at an angle other than normal to the knife edge without close control of the location of the wire relative to the knife edge as it is scraped across the knife edge.

While the invention has been particularly shown and described with reference to the preferred embodiments thereof, it will be understood by those skilled in the art that various alterations in form and detail may be made therein without departing from the spirit and scope of the invention.

The embodiments of the invention in which an exclusive property or privilege is claimed are defined as follows:

1. Stator manufacturing and testing apparatus comprising:

a support for a stator to be manufactured;

apparatus for winding stator coils having lead wires and wound from insulated magnet wire on the stator while the stator core is positioned on the support, said winding apparatus being located at a winding station;

plural wire clamps adapted to temporarily receive a portion of said stator coil lead wires, each of said clamps comprising a pair of opposed clamp jaws;

a structure made from electrical insulating material that supports said wire clamps in fixed relation to said stator support;

apparatus for inserting a portion of the stator coil lead wires into said wire clamps at said winding station before said lead wires are connected to terminal members mounted on said stator core;

an electrical tester; and means for electrically connecting said tester to said portions of said stator coil lead wires clamped by said clamp wherein said connecting means comprises a knife edge formed on one of said jaws of each of said clamps and confronting the other of said jaws so that said knife edge cuts into a coil lead wire while it is being inserted into said clamp, and means for electrically connecting said one of said jaws to said tester.

2. The apparatus of claim 1 wherein said one of said jaws of said each of said clamps further comprises a wire-guiding shield having wire-engageable surfaces facing said other jaw and extending adjacent said knife edge that limit the extent to which said knife edge can cut into the coil lead wire while it is being inserted into said clamp.

3. Stator manufacturing and testing apparatus comprising:

a support for a stator to be manufactured;

apparatus for winding stator coils having lead wires and wound from insulated magnet wire on the stator while the stator core is positioned on the support, said winding apparatus being located at a winding station;

plural wire clamps adapted to temporarily receive a portion of said stator coil lead wires, each of said clamps comprising a pair of opposed clamp jaws, one of said jaws of each of said clamps having a window extending therethrough opening to a surface of the other jaw over which a stretch of said clamped lead wire extends;

a structure made from electrical insulating material that supports said wire clamps in fixed relation to said stator support;

apparatus for inserting a portion of the stator coil lead wires into said wire clamps at said winding station before said lead wires are connected to terminal members mounted on said stator core;

an electrical tester; and means for electrically connecting said tester to said portions of said stator coil lead wires clamped by said clamp wherein said connecting means comprises probes corresponding to each said clamp electrically connected to said tester, each said probe movable through the window in its corresponding clamp to an extended position and having a lead wire engaging end provided with a surface shaped to penetrate said lead wire extending over the surface of said other jaw when said probe is moved to said extended position.

4. The apparatus of claim 3 wherein said probe corresponding to each said clamp is movable perpendicular to the stretch of lead wire clamped by its corresponding clamp.

5. A stator manufacturing and testing method comprising the steps of:

inserting a portion of each of a plurality of stator coil lead wires into respective clamps by which said lead wires are temporarily gripped before the coil lead wires are connected to said terminals members on a stator core; and electrically connecting an electric tester to the portions of said lead wires held by said clamps.

6. The method of claim 5 wherein said connecting step comprises penetrating an insulating coating on each said lead wire with an electrically-conductive portion of said respective clamp, each said portion of said respective clamp being electrically connected to said electric tester.

7. The method of claim 6 further comprising providing wire-guiding shields on each said clamp having wire-engageable surfaces extending adjacent said portion of said clamp, said shields limiting the extent to which said portions can cut into the coil lead wires while they are gripped by said clamps.

8. The method of claim 5 wherein said clamps comprise a pair of opposed jaw, one of said jaws having a window extending therethrough that opens to a surface of the other of said jaws over which a stretch of clamped lead wire extends, and wherein said connecting step comprises moving a probe corresponding to each said clamp and electrically connected to said tester through the window in the corresponding clamp jaw to an extended position, each said probe having a lead wire engaging end provided with a surface shaped to penetrate the lead wire extending over the surface of said other jaw when said probe is moved to said extended position.

9. The method of claim 8 wherein said connecting step further comprises moving said probe corresponding to each said clamp perpendicular to the stretch of lead wire clamped by its corresponding clamp.

10. The method of claim 5 further comprising the step of:

prior to said inserting step, winding coils of insulated magnet wire onto a stator core.

11. The method of claim 10 wherein said tester is electrically connected to said lead wires by penetrating the insulating coating on said lead wires by probes that are electrically connected to said tester.

12. The method of claim 10 wherein said steps of winding and inserting are accomplished with the stator supported at a single location, and further including the step of transferring said stator and said clamps to a different location at which said testing step is carried out.

13. The method of claim 12 wherein said stator is supported on a rotatable turret and said transferring step is carried out by rotating said turret.

14. Stator manufacturing and testing apparatus comprising:

a support for a stator to be manufactured;

apparatus for winding stator coils having lead wires and wound from insulated magnet wire on the stator while the stator core is positioned on the support, said winding apparatus being located at a winding station;

plural wire clamps adapted to temporarily receive a portion of said stator coil lead wires, each of said clamps having a pair of clamp jaws comprising a fixed jaw and a movable jaw, said movable jaw having a window extending therethrough that opens to a surface of said fixed jaw over which a stretch of a clamped lead wire extends;

a structure made from electrical insulating material that supports said wire clamps in fixed in relation to said stator support;

a plurality of probes, one for each of said clamps, mounted for movement toward and away from said surfaces of said fixed clamp jaws, each of said probes having a lead wire engaging end provided with a surface shaped to penetrate a lead wire extending over the associated said fixed jaw surface;

a plurality of actuators, one for each of said probes, having piston rods to which said probes are connected, for moving said probes toward and away from said fixed jaw surfaces;

apparatus for inserting the stator coil lead wires into said wire clamps at said winding station before the lead wires are connected to terminal members mounted on said stator core;

an electrical tester; and electrical connectors between said probes and said electrical tester.

15. The apparatus of claim 14 further including lead wire connect apparatus at a lead wire connect station that engages the coil lead wires temporarily held by said clamps and connects them to said terminal members and stator transfer apparatus that moves the stators from the winding station to the lead wire connect station, and wherein said probes are moved into engagement with lead wires at said lead wire connect station.

16. The apparatus of claim 15 wherein said actuators are fixedly mounted on a machine frame separate from said stator transfer apparatus.

17. The apparatus of claim 15 wherein said transfer apparatus comprises a turret.

18. The apparatus of claim 14 wherein said surface of said probe comprises a knife edge.

19. The apparatus of claim 14 wherein said surface of said probe comprises plural knife edges.

20. A wire clamp that temporarily clamps a stator coil lead wire which has been inserted therein by a lead pull device, said wire clamp comprising:

a pair of relatively movable clamp jaws adapted to temporarily receive a portion of a stator coil lead wire inserted therein by a lead pull device, said clamp jaws having mutually-confronting stator coil lead wire-engaging surfaces for gripping said stator coil lead wire;

one of said clamp jaws having a window extending therethrough opening to the other of said clamp jaws and exposing a portion of said stator coil lead wire gripped by said clamp jaws so that a probe may be extended through said window into engagement with said portion of said stator coil lead wire; and spring means biasing said clamp jaws toward one another to grip said stator coil lead wire by and between said stator coil lead wire-engaging surfaces.

* * * * *